United States Patent [19]

Nishizawa et al.

[11] 4,038,610
[45] July 26, 1977

[54] LUMINOSITY CONTROL SYSTEM EMPLOYING SEMICONDUCTOR LASERS

[75] Inventors: Jun-ichi Nishizawa; Ichiemon Sasaki; Kaoru Takahashi, all of Sendai, Japan

[73] Assignee: Semiconductor Research Foundation, Japan

[21] Appl. No.: 514,286

[22] Filed: Oct. 11, 1974

Related U.S. Application Data

[63] Continuation-in-part of Ser. No. 286,882, Sept. 7, 1972, abandoned, which is a continuation-in-part of Ser. No. 56,582, July 20, 1970, abandoned, and a continuation-in-part of Ser. No. 684,395, Nov. 20, 1967, abandoned.

[30] Foreign Application Priority Data

Nov. 21, 1966 Japan ................................. 41-76486
May 10, 1967 Japan ................................. 42-29675

[51] Int. Cl.$^2$ ............................................. H01S 3/10
[52] U.S. Cl. ..................... 331/94.5 H; 330/4.3; 331/94.5 M; 332/7.51
[58] Field of Search ................. 331/94.5 H, 94.5 C, 331/94.5 M; 357/18; 330/4.3; 332/7.51

[56] References Cited

U.S. PATENT DOCUMENTS

| 3,303,431 | 2/1967 | Fowler | 331/94.5 H |
| 3,479,612 | 11/1969 | Seidel | 331/94.5 C |

*Primary Examiner*—Eugene R. LaRoche
*Attorney, Agent, or Firm*—Robert E. Burns; Emmanuel J. Lobato; Bruce L. Adams

[57] ABSTRACT

A luminosity control device comprises a first semiconductor laser operable in a spontaneous mode to emit noncoherent light and in a laser mode different from its inherent laser mode to emit coherent light. The first semiconductor laser is electrically biased into its spontaneous laser mode. A second semiconductor laser is operated in a laser mode to emit coherent light which is applied to the first semiconductor laser to optically bias the first semiconductor laser into the laser mode of the second semiconductor laser. The second semiconductor laser is electrically biased into operating in its laser mode and the optical coupling between the two semiconductor lasers is such that the coherent light output from the first semiconductor laser varies exponentially with respect to the electrical energy input into the second semiconductor laser.

12 Claims, 18 Drawing Figures

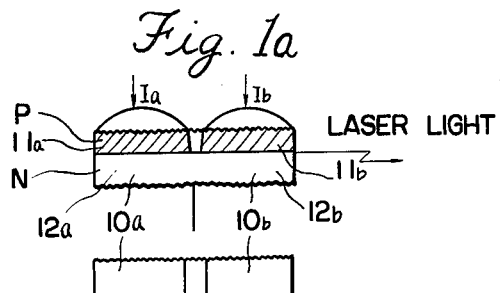
Fig. 1a
Fig. 1b
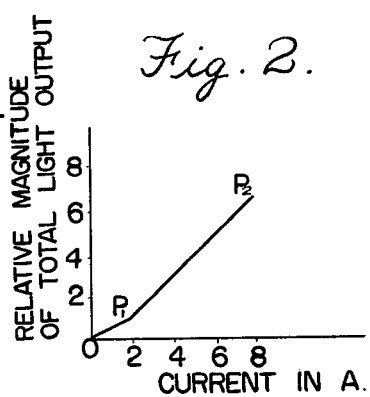
Fig. 2.
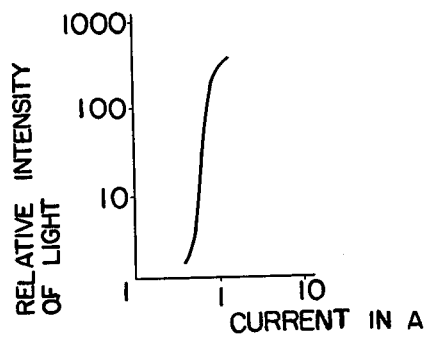
Fig. 3.
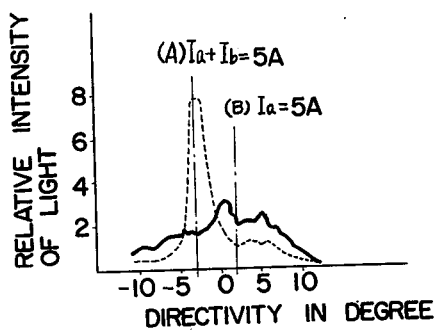
Fig. 4.
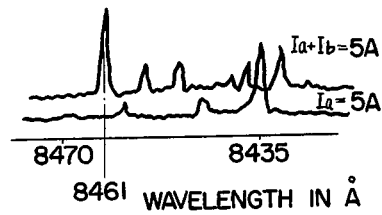
Fig. 5a
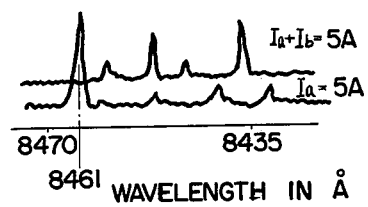
Fig. 5b

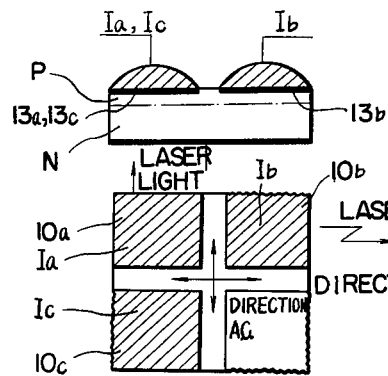
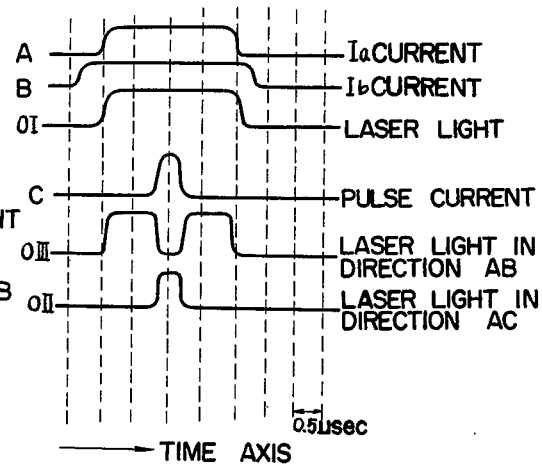
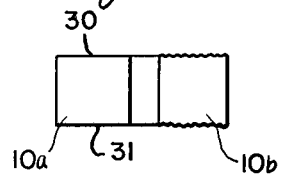
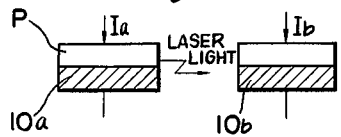
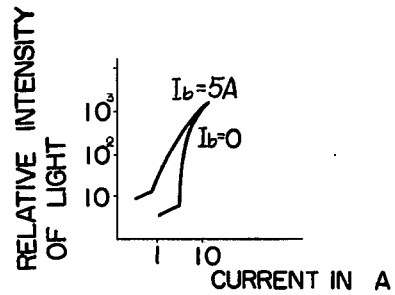
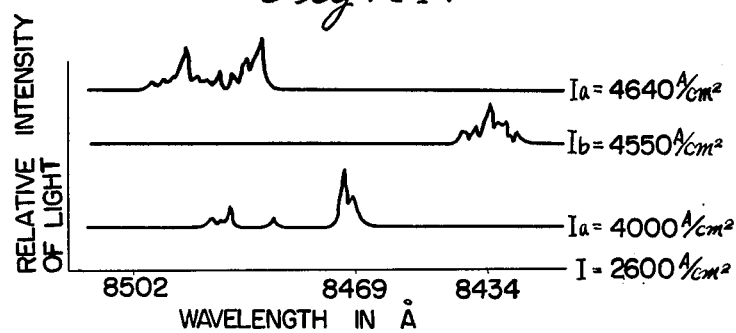

LUMINOSITY CONTROL SYSTEM EMPLOYING SEMICONDUCTOR LASERS

BACKGROUND OF THE INVENTION

The present application is a continuation-in-part of patent application Ser. No. 286,882 filed on Sept. 7, 1972, now abandoned and which was a continuation-in-part of patent application Ser. No. 56,582 filed on July 20, 1970 and now abandoned, and which was a continuation-in-part of patent application Ser. No. 684,395 filed on Nov. 20, 1967 and now abandoned.

The present invention relates in general to a luminosity control system and more particularly, to a system for controlling the light output from a semiconductor laser device by transforming or converting the mode of light emitted by the latter into a laser mode different than the inherent laser mode of the semiconductor device itself.

Various types of luminosity control devices have been developed and have found utility as light sources in medical applications, the communication area and in many other fields. The conversion of electrical energy to optical energy has been the topic of much research and the present invention is directed to a device for greatly increasing the efficiency of this energy conversion. It is well known that current injection-type semiconductor junction devices may be operated to emit laser light and more particularly, that a semiconductor junction could selectively emit either spontaneous light or laser light in accordance with the level of electric current supplied thereto. These particular current injection-type semiconductor devices are known in the art as laser diodes.

It has therefore become desirable to have a luminous semiconductor junction device which provides a high intensity light output having a predetermined luminous mode, but heretofore it has been extremely difficult and inefficient to obtain such a result utilizing a single pn junction.

It is well known that when two laser diodes are optically coupled together and current is selectively applied to each laser diode to cause it to emit light, the light from one of the diodes enters the active region of the other diode whereupon the other diode will emit laser light. In effect, the light emitted from one of the laser diodes enters into and is amplified by the other laser diode and is emitted therefrom as laser light. The value of current which must be applied to a laser diode to cause it to emit laser light, exclusive of any other biasing, is termed the threshold current. If a first laser diode is biased sufficiently with a current flow, it will emit laser light in its inherent laser mode and this inherent laser mode is a function of the impurity distribution in the laser's active region, the type and concentration of impurity in the diode, and the particular configuration of the resonator cavity itself. Each laser diode has its own inherent laser mode defined in accordance with the above-mentioned parameters and each inherent laser mode is characterized by having its own laser wavelength, directivity and polarization. Thus, if a laser diode is excited or biased into emitting laser light, whether by a current flow in excess of the threshold current or by injection light incident upon the active region of the diode, the laser diode will generally emit laser light in its inherent laser mode.

Numerous luminous semiconductor devices are known wherein electrical energy is converted into optical energy in the form of laser light but no conversion techniques are known wherein the conversion is accomplished with an efficiency approaching that of the present invention. The high efficiency obtained by practicing the present invention is due to the mode conversion of one laser diode to operate in the inherent laser mode of another laser diode and such a phenomenon is quite different from the phenomena described in U.s. Pat. No. 3,303,431 to A. B. Fowler, U.S. Pat. No. 3,239,688 to P. J. Price and U.S. Pat. No. 3,427,563 to G. J. Lahser and such will be readily understood by comparing the polarization, directivity and wave lengths of the laser light obtained in each instance.

As delineated in the aforementioned references, it is well known that a beam of light emitted by a laser device onto a surface may be selectively amplified or attenuated due to reflection from the surface. The present invention utilizes this pnenomenon in conjunction with a semiconductor laser diode having a preselected inherent laser mode of operation. According to the principles of the present invention, a beam of spontaneous light having a wide range of wave lengths may be converted into a beam of laser light having a narrow range of wave lengths and vice versa. In the latter situation, a laser light input of very low magnitude can be used to cause a great decrease in the corresponding spontaneous light output. Alternatively, a beam of light may have its wavelength shifted or it may be emitted at different wavelengths.

The disadvantage of the aforementioned prior art types of laser diodes is that the conversion of electrical energy into optical energy is accomplished inefficiently and such greatly restricts the many application to which the laser diodes could be used. if a single laser diode is biased into its inherent laser mode by a suitable current flow, it has been found that the optical output is directly or linearly proportional to the electrical energy input. Similarly, if one laser diode is biased above its threshold level by a suitable current flow to emit laser light and this laser light is optically coupled to the active region of another laser diode which is electrically biased below its threshold value, the other laser diode will emit laser light but its output radiation is substantially a linear function of the combined electrical energy inputs to the two laser diodes. Since it is frequently desirable to obtain a laser output which varies exponentially with the current input, the present current injection-type semiconductor devices have enjoyed only limited or restricted usage.

The present invention is concerned with increasing the efficiency of energy conversion in obtaining laser light based upon the principle of mode conversion of the laser emitting diode. As aforementioned, every semiconductor laser diode has an inherent laser mode of operation determined by the physical size and configuration of the diode and the type and concentration of the impurity. When a first laser diode is biased below its threshold level, it can be made to emit laser light in accordance with the principles of the present invention by operating a second laser diode in its inherent laser mode and directing its laser light onto the active region of the first laser diode whereupon the first laser diode will emit laser light not in its inherent laser mode, but rather in the inherent laser mode of the second laser diode. The first laser diode has thus been converted or shifted into operating in a laser mode identical to the inherent laser mode of the second laser diode. The interaction or optical coupling between the first and second laser diodes rapidly increases until the first laser diode emits laser light in the inherent laser mode of the second laser diode. Almost all of the electrical energy applied to both laser diodes is eventually converted into laser light having the characteristics of the inherent laser mode of the second laser diode and essentially no other light is emitted. The directivity, polarization and wavelengths of laser light emitted from laser diodes optically coupled together in the above-mentioned manner have been carefully studied and it has been found that the increased efficiency of conversion is due to the mode change of one of the diodes.

The principles of the mode conversion according to the present invention are hereinafter described. It is known in the art that when carriers are supplied to an active region of a laser diode and if the carriers are permitted to be freely supplied to that region, then the laser diode can emit laser light in each and every permissible luminous mode. This causes only amplification and optical stimulation but no conversion of mode in that sense of the present invention.

On the other hand, if the number of the carriers supplied to the active region of the laser diode is limited, then the diode can no longer emit light in each and every permissible luminious mode. Rather the carriers supplied to the active region of the diode are used in emitting light in the most predominant mode therein. This most predominant mode is that mode in which light comes into the active region of the diode from another diode optically coupled thereto and thus light emitted by the first diode increases in intensity in that mode alone while light is extinguished in the remaining modes.

Once the mode conversion through the optical coupling as above described has occurred, laser light emitted from the diode results in an increase exponential with respect to a current applied thereto. In other words, this exponential increase in the light output indicates the occurrence of the mode conversion according to the invention.

The limitation of the number of carriers supplied to a laser diode can be accomplished by suitably selecting the magnitude of either a resistor connected in series with the laser diode or the impedance of the electric source connected across the diode so as to bring the diode into an operating state approximating a constant current state.

More specifically, a laser diode having a current flowing therethrough is responsive to the incidence of light upon the active region thereof from another laser diode to change the voltage applied thereacross. It has been experimentally found that the optical coupling contributing to the mode conversion according to the invention is brought about only when the change in voltage is of a relative value equal to or more than 1%. Otherwise the desired mode conversion does not occur.

It is now assumed that before the optical coupling, the laser diode has a current $I_o$ flowing therethrough and a voltage $V_J$ applied across the junction disposed therein and after the optical coupling, it has a current $I_o + \Delta I_o$ flowing therethrough and a voltage $V_J + \Delta V_J$ applied across the junction. It is further assumed that the laser diode includes a series resistance $R_S$ therein and the associated electric source has an internal impedance $Z_o$ and a voltage $V_o$. Under the assumed condition, a voltage $V_D$ applied across the diode is expressed by $$V_D = V_J + I_o R_S \tag{1}$$

before the optical coupling. After the diode has been optically coupled to another laser diode, the voltage $V_D$ changes to a voltage $V'_D$ expressed by $$V_D' = V_J + \Delta V_J + (I_o + \Delta I_o) R_S \tag{1'}$$

Subtracting the equation (1) from the equation (1)' yields a change in voltage expressed by $$V_D' - V_D = \Delta V_J + \Delta I_o R_S$$

As above described, a change in voltage ($V'_D - V_D$) should be of a value equal to or more than 1% of the initial voltage $V_D$, in order to cause the mode conversion according to the invention. Thus the following relationship must be met:

$$\frac{V_D' - V_D}{V_D} = \frac{\Delta V_J + \Delta I_o R_S}{V_D} \geq 1/100 \tag{2}$$

On the other hand, the source having the voltage $V_o$ and the internal impedance $Z_o$ is connected across the diode. Therefore before the optical coupling, the equation $$V_o = I_o(R_S + Z_o) + V_J = I_o Z_o + V_D$$

holds and after the optical coupling the following equation holds:

$$V_o = (I_o + \Delta I_o)(R_S + Z_o) + V_J + \Delta V_J$$
$$V_o = (I_o + \Delta I_o) Z_o + V'_D$$

and a difference between the equations (4) and (3) is divided by $V_D$ to obtain the equation $$\frac{V_D' - V_D}{V_D} = \frac{-\Delta I_o Z_o}{V_D}$$

Replacing $V_D$ on the righthand side of the equation (5) by $V_D$ in the equation (3) yields $$\frac{V_D' - V_D}{V_D} = \frac{-\Delta I_o Z_o}{V_o - I_o Z_o}$$

which yields:

$$\frac{V_D' - V_D}{V_D} = \frac{-\Delta I_o}{I_o} \frac{Z_o}{\frac{V_o}{I_o} - Z_o} \tag{6}$$

From the euqation (2), it is seen that the equation (6) is equal to or more than 1/100. Therefore the following relationship holds:

$$\frac{\Delta I_o}{I_o} \leq \frac{1}{100} \frac{\frac{V_o}{I_o} - Z_o}{Z_o} \tag{7}$$

or $$\mu = \frac{\Delta I_o}{I_o} \frac{Z_o}{\frac{V_o}{I_o} - Z_o} \leq 1/100$$

From the equation (7) is is appreciated that the optical coupling should not cause a great increase in current. In other words, the diode must be operated in a state approximating a constant current state.

In order to determine whether or not the relationship (7) would be held, experiments were conducted with a multiplicity of pairs of laser diodes optically coupled to each other. In the experiments, the internal impedance $Z_o$ of the source changed to vary the magnitude of the lefthand side of the relationship (7), or in other words the parameter $\mu$, and the dependency of the light output from the diode was measured. The results of the experiments indicate that the light output increases for small values of $\mu$. It has been further found that the value of $\mu$ must be equal to or less than 0.01 to effectively carry out the invention.

SUMMARY OF THE INVENTION

Accordingly, it is an object of the present invention to provide a new and improved luminosity control system for controlling the light output from a laser device.

It is another object of the present invention to provide a new and improved control system capable of readily controlling or modulating a beam of light emitted from a semiconductor laser device.

It is a further object of the present invention to provide a new and improved luminosity control system for controlling the light output from a laser device to obtain a safe and strong beam of laser light substantially free from external disturbances, such as noise.

It is yet another object of the present invention to provide a luminosity control system wherein one laser diode having an inherent laser mode of light emission may be biased by light energy emitted from another laser diode into emitting laser light in a laser mode other than its inherent laser mode.

It is still another object of the present invention to provide a new and improved laser device capable of functioning as a switch or logic element and having a high stability and a low power consumption.

Briefly, the invention accomplishes the above cited objects by the provision of a luminosity control system comprising a luminous semiconductor device biased into emitting a beam of spontaneous light and means for selectively supplying to the semiconductor luminous device sufficient biasing energy selected from the group of biasing means comprising an electric current, optical energy and electrons to convert the spontaneous mode of light into a laser mode of light to selectively control the intensity of the emitted light.

BRIEF DESCRIPTION OF THE DRAWINGS

Other objects and advantages of the present invention will become more readily apparent from the following detailed description when taken in conjunction with the accompanying drawings in which:

FIGS. 1a and 1b are, respectively, a schematic sectional and a schematic side elevational view of a semiconductor laser device embodying the principles of the present invention;

FIG. 2 is a graph showing the relative magnitude of total light output from the device illustrated in FIG. 1 versus the magnitude of current supplied to the device with the device not being sufficiently biased to effect the mode conversion in accordance with the teachings of the present invention;

FIG. 3 is a graph showing the relative intensity of the total light output from the device illustrated in FIG. 1 versus the magnitude of biasing current with the device being properly biased to effect the mode conversion in accordance with the teachings of the present invention;

FIG. 4 is a graph illustrating the directivities of the beam of light emitted from the device of FIG. 1 when same is operated in the converted mode;

FIG. 5a and 5b are curves illustrating emission spectra for the device shown in FIG. 1 in different directions;

FIG. 6a and 6b are views similar to FIGS. 1a and 1b but illustrating another embodiment of laser device embodying the principles of the present invention;

FIG. 7 depicts several electric and optical waveforms useful in explaining the operation of the device illustrated in FIG. 6;

FIG. 8 is a schematic side elevational view of a modification of the present invention;

FIG. 9 illustrates a device comprised of a pair of semiconductor lasers physically separated and operable for effecting mode conversion;

FIG. 10 is a graph having axes similar to FIG. 3 but representing parameters of the device illustrated in FIG. 9;

FIG. 11 illustrates emission spectra curves for the device illustrated in FIG. 9;

DESCRIPTION OF THE PREFERRED EMBODIMENTS

Figure 12:
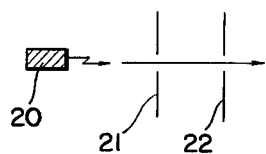
FIGS. 12, 13 and 14 are schematic views of various means for optically effecting the mode conversion in accordance with the principles of the present invention.

In order to actually realize the principles of the present invention, a single luminous semiconductor junction device of the current injection type may have a low magnitude biasing current applied thereto to change the light output from the spontaneous mode to a laser mode. Alternatively, the luminous modes developed within a common resonator formed by a semiconductor luminous device itself may interact on each other to cause the mode conversion. The mode conversion may be accomplished in a semiconductor laser device comprising two or more separate resonators through the interaction between the resonator cavities. It has been found that most of the existing communication circuits, such as logic circuits, amplifier circuits, etc., may advantageously utilize the mode conversion of the present invention outlined above and described in more detail hereinafter.

Referring now to the drawings, and FIG. 1 in particular one embodiment of a luminosity control device according to the present invention is shown. A first semiconductor diode 10a has a region 11a composed of p-type material and a region 12a composed of n-type material disposed to define a pn junction therebetween. Another semiconductor diode 10b comprises a region 11b of p-type material disposed atop a region 12b of n-type material defining a pn junction therebetween. The two diodes 10a and 10b comprise a wafer of semiconductor material wherein the two diodes are laterally aligned with respect to each other. The wafer is formed with a pair of optically rough opposed major surfaces or faces and a pair of plane or minor side faces which cooperate together to form a resonator cavity for the laser light. Suitable electrodes attached to each of the p regions and also the common n region as shown in FIG. 1.

In operation, a current Ia is supplied to the diode 10a and a current Ib is concurrently supplied to the diode 10b and these currents flow through their associated pn junctions causing laser light to be emitted from the laser diode 10b in a direction as shown in the drawing. The current values applied to each of the diodes are suitably choosen to cause the laser diode 10b to emit laser light in the inherent laser mode of the diode 10a and such will be described in more detail hereinafter.

A typical relationship between the total current supplied to a luminosity control device, such as shown in FIG. 1, and the total light output from the device is illustrated in FIG. 2. The relative magnitude of the total light output is represented along the ordinate and the sum of the currents Ia and Ib in amperes is represented along the abscissa. As can be seen, the relationship is a linear one and includes a range $OP_1$ wherein the diode 10b emits spontaneous light and a range $P_1P_2$ wherein the diode 10b emits laser light.

In FIG. 2 is illustrated the case wherein the diodes 10a and 10b are optically coupled to each other in the conventional manner whereby the diode 10b can emit laser light in an unlimited multiplicity of luminous modes. Thus each of the luminous modes cannot have a high electromagnetic field strength. Also the stimulated emission is not strong and the applied energy or the carriers are distributed among the multiplicity of luminous modes so that the individual modes cannot be strengthened. Thus the optically coupled diode can only emit light having an intensity proportional to a magnitude of the current externally supplied thereto or to the number of the carriers supplied thereto. This causes the range $OP_1$, where spontaneous light is emitted, to be different in efficiency from the range $P_1P_2$ where laser light is emitted, but the linearly proportional relationship between the light output and current is maintained in each of those two ranges.

In contrast thereto, FIG. 3 depicts the relationship between the total light output and the total current input of a device operated according to the principles of the present invention. According to the principles of the invention, the laser diodes 10a and 10b are operated with approximately constant currents so as to cause a unique mode conversion as will be subsequently described. With light from the diode 10a falling upon the diode 10b to cause emission of laser light from the latter, the diode 10b is substantially in the constant current mode of operation. Therefore the diode 10b is inhibited from emitting laser light in each and every permissible luminous mode and only permitted to emit laser light in a particular luminous mode having a strong electromagnetic field. It is to be noted that this particular luminous mode is that mode in which the laser diode 10a emits light incident upon the diode 10b. Under these circumstances, the total amount of current externally supplied to the diode 10b is consumed in emitting laser light in that particular luminous mode. This causes a still further increase in the field strength. Since the degree to which the stimulated emission is obtained is proportional to the nth power of the field strength where n is greater than one (1), the stimulated emission in the luminous mode as above described is increasingly strengthened.

FIG. 3 illustrates the light output characteristic of the diode in which the mode conversion has been brought about as above described. In FIG. 3, the ordinate represents the relative intensity of the emitted light on a logarithmic scale and the abscissa represents the total current Ia supplied to the diode 10a only. FIG. 3 represents a typical curve obtained when the device of FIG. 1 is operated such that the current Ib is at a small magnitude to cause the laser diode 10b to emit spontaneous light distributed over a wide range of wave lengths, for example, in the order of 150A, while the current Ia supplied to the laser diode 10a is progressively increased to effect emission of laser light from the laser diode 10b having only a very narrow range of wave lenghts. A laser light thus emitted from the laser diode 10b has a characteristic of the inherent laser mode of the laser diode 10a and not the characteristic of its own inherent laser mode. It will be noted from FIG. 3 that a slight change in the current input Ia to the laser diode 10a causes a great change in the light output from the laser diode 10b and hence the efficiency of quantum conversion is greatly enhanced with respect to the prior art operation depicted in FIG. 2.

As shown in FIG. 1 the light emitted by the diodes 10a and 10b is emitted along parallel directions because of the relative orientation of the diodes. It has been found experimentally that in order for mode conversion to occur in diode 10b, the light emitted by diodes 10a and 10b, having wavelengths $\lambda_A$ and $\lambda_B$, respectively, and the current $I_B$ through diode 10b must satisfy the following relationships:

$$60A \geq \lambda_B - \lambda_A \geq 3A \qquad (8)$$

and $$I_B \geq 0.8 I_B\text{th} \qquad (9)$$

where $I_B$th is the threshold current at which the emission of laser light from diode 10b occurs. If these conditions are met than diode 10b will emit light having a wavelength determined by the wavelength $\lambda_A$ of laser light emitted by diode 10a and incident on diode 10b.

It has been experimentally confirmed that if the difference between the wavelengths $\lambda_A$ and $\lambda_B$ exceeds about 60A, then the efficiency of the mode conversion will be greatly reduced. For differences in wavelength much greater than 60A, mode conversion will not occur at all. On the otherhand, if the difference between the wavelengths $\lambda_A$ and $\lambda_B$ is less than about 3A additional complicated interactions other than mode conversion are developed. Therefore, in accordance with experimental results, mode conversion is most effectively and efficiently achieved when the conditions of relationship (8) hold.

It has also been determined experimentally that if the value of the current flowing through the diode in which mode conversion is to be effected is less than about eighty percent of the value of the threshold current, the gain of the diode will be low and it will be difficult to cause mode conversion. Therefore, in carrying out the present invention, the conditions set forth in the relationship (9) should preferably be met.

The mode conversion of the laser diode 10b is naturally accompanied by variations in directivity, polarization and wavelength of the emitted laser beam. In FIG. 4, wherein the ordinate represents the relative magnitude of the light output from the laser device as above-described and the abscissa represents the direction of propagation of the light beam measured angularly in degrees from a reference direction, the dotted line corresponds to the case when the sum of the currents Ia and Ib, flowing through the diodes 10a and 10b, respectively, was maintained at a magnitude of 5 amperes. The solid line corresponds to the case when a current Ia of 5 amperes flowed through the diode 10a alone. From FIG. 4 it can be appreciated that the luminosity control laser device exhibits different directivities of the emitted light beam in the different operating conditions.

The mode conversion further changes the spectral characteristics of the light beam emitted from the associated laser device in accordance with the directions of its propagation as shown in FIG. 5, wherein the ordinate represents the relative intensity of the spectral line and the abscissa represents the wavelength of the emitted light in angstroms. FIGS. 5a and 5b respectively illustrate the spectral characteristics in the angular directions designated by the reference characters (A) and (B), respectively, in FIG. 4. FIG. 5a shows that a spectral line at a wavelength of 8461 A was amplified when the currents were supplied to both diodes while this spectral line decreased in magnitude when the current was supplied to only one of the diodes. However, FIG. 5b shows the results reversed from those illustrated in FIG. 5a.

Figure 15:
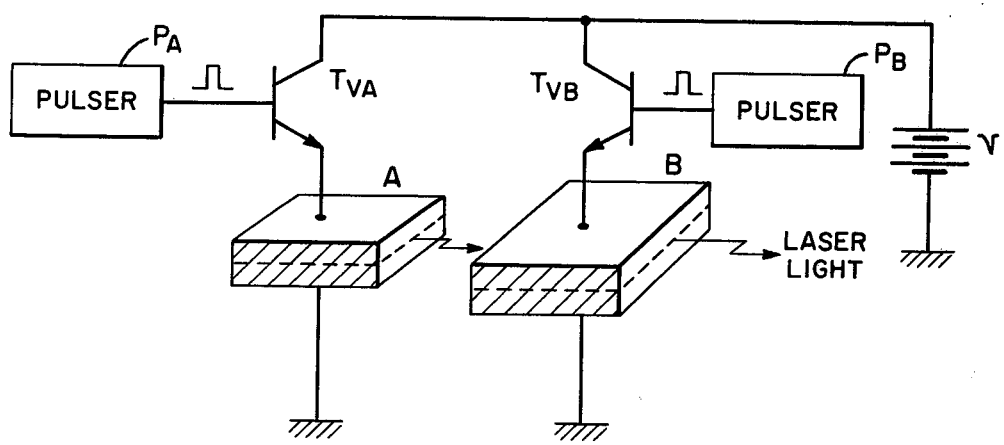
FIG. 15 is a schematic view of a circuit embodying the semiconductor laser device of the present invention.

According to the principles of the invention, a laser diode can be operated in a substantially constant current mode of operation by connecting it in a circuit as shown in FIG. 15. In an arrangement shown in FIG. 15, a laser diode A is of the Fabry-Perot type having a pair of lateral opposite faces roughened as shown by the hatched portion and including a pair of main opposite faces connected to an emitter electrode of a transistor $T_{VA}$ and ground respectively. Another laser diode B is identical in construction to the laser diode A and similarly connected to another transistor $T_{VB}$ and ground. The transistors $T_{VA}$ and $T_{VB}$ are connected at the base electrodes to respective pulsers or pulse generators $P_A$ and $P_B$ and their collector electrodes are connected together to a positive terminal of a source of direct current V which has its negative terminal connected to ground.

Each pulser $P_A$ and $P_B$ supplies a train of rectangular pulses having for example, a duration of 1 microsecond, to the base electrode of its associated transistor $T_{VA}$ and $T_{VB}$ so that the emitter current for each transistor is maintained substantially constant. For example, the sum of both emitter currents may be 5 amperes. The source V, having for example a voltage of 30 volts, supplies current to the diodes A and B through the respective transistors $T_{VA}$ and $T_{VB}$. Since the emitter current for each transistor is maintained substantially constant as described above, a constant current is supplied to each of the diodes A or B even though the diodes may change in internal impedance.

When the laser diode B is optically coupled to the diode A as shown by the arrow in FIG. 15 to emit laser light, the lifetime of the injected carriers decreases whereby the internal impedance of the diode is reduced. This would tend to increase the current flowing through the diode but that current is maintained constant through the operation of the associated transistor. Therefore light from the diode A falling upon the diode B converts the luminous mode of the diode B to the luminous mode in which the diode A emits light. Thus the diode B emits laser light in the luminous mode of the diode A. The current limitation as above described results in an increase in efficiency with which electric energy is converted to optical energy resulting in an exponential characteristic such as shown in FIG. 3.

While the invention has been described in conjunction with a single wafer of semiconductive material including therein a pair of discrete laser diodes, it is to be understood that it is equally applicable to a single laser diode. In this case, a current I is first supplied to the single laser diode and then an incremental current ΔI is superposed over the current I whereupon the mode conversion takes place.

Referring now to FIG. 6a, 6b there is disclosed a modification of the present invention. The laser device illustrated comprises a wafer of semiconductive material having a square shape divided into four quadrants. On three of the quadrants are positioned three semiconductor diodes 10a, 10b and 10c having substantially the same construction and being isolated from each other by a pair of orthogonal elongated zones on the wafer material parallel to the respective edges. As seen in FIG. 6b, there is no diode disposed on the remaining wafer quadrant. The semiconductor diode may be similar to that shown in FIG. 1 and is shown as having a p-type region and an n-type region disposed to define a pn junction therebetween. The wafer has electrodes 13a, 13b and 13c disposed in ohmic content with the lower major face of the common n region. The electrodes may be disposed on their associated face portions by first electro-plating nickel on that portion, as well known in the art. Each side face of the wafer except for the opposed side faces of the diode pairs 10a–10b and 10a–10c consists of a plane of cleavage which is optically rough whereas the above-mentioned opposed side faces are effectively smooth. As seen in FIG. 6b, the side faces of the wafer quadrant having formed thereon no diode is also optically rough. Thus, the outer opposed side faces of the diodes 10a and 10b form reflector mirrors and define a resonator for light emitted by the diode pair 10a and 10b as will be described hereinafter. Similarly, the outer opposed side faces of the diodes 10a and 10c form reflector mirrors or a resonator for these diodes.

The operation of the laser device illustrated in FIGS. 6a, 6b will now be described with reference to FIG. 7 wherein various waveforms appearing in the device are depicted on a common time basis graduated in 0.5 microsecond intervals. As in the device illustrated in FIG. 1, a pulse of current Ia (waveform A) having, for example, a peak value of 7 amperes and a pulse of current Ib (waveform B) having, for example, a peak value of Ia amperes are supplied substantially concurrently to the diodes 10a and 10b, respectively, to effect a mode conversion to emit a pulse of laser light (waveform OI) from the wafer in a direction of the double headed arrow AB. The duration of the emitted laser light has a period substantially equal to the duration of the shorter pulse which, in this example, is the pulse Ia.

While the pulse Ia is still being supplied to the diode 10a, another current pulse Ic (waveform C) narrower than the pulse Ia and having, for example, a peak value of 4 amperes, is supplied to the diode 10c to emit a pulse of laser light (waveform OII) from the wafer in a direction of the double headed arrow AC. Then the optical pulse OII operates to convert the mode of the optical pulse OI, orthogonal thereto, to thereby emit laser light (waveform OIII) in the direction of the arrow AB. As seen in FIG. 7, the waveform OIII consists of a pair of optical pulses generated by a space inversely complementary in shape to the optical pulse OII. In other words, that portion of the pulse OI in the pulse OIII corresponding to the pulse OII does not occur. Thus, it will be appreciated that the laser device illustrated in FIGS. 6a, 6b is an optical flip-flop device including the laser diodes 10b and 10c as an ON switch and an OFF switch, respectively.

The operation of the laser device just described in conjunction with FIGS. 6a, 6b and 7 may also be performed with an arrangement as illustrated in FIG. 8.

The arrangement shown in FIG. 8 is substantially identical to that illustrated in FIG. 1 except that one of the laser diodes 10a has a pair of opposed major faces 30 and 31 which are optically flat. As in FIG. 1, a pair of currents Ia and Ib are supplied in substantially concurrent relationship to both diodes 10a and 10b, respectively. This causes the diode 10a to emit a laser light with its major faces serving as the reflector mirrors while the diode 10b emits a laser light with the pair of opposed side faces of the device functioning as the reflector mirrors. Both beams of light are propagated orthogonally to each other. Thus, one of the light beam functions to convert the mode of the other beam as in the device shown in FIG. 6a, 6b.

If diode 10b is biased above its threshold to emit laser light and to optically bias diode 10a to develop mode conversion, then the orthogonal relationship between the light emitted by the two diodes results in a slightly different wavelength relationship for mode conversion than as described hereinabove. If $\lambda_A$ is the wavelength of the light emitted by laser 10a and $\lambda_B$ is the wavelength of the light emitted by laser 10b then, in order for mode conversion to occur, the following relationships must hold:

$$60A > \lambda_A - \lambda_B \geq 0 \tag{10}$$

and $$I_A \geq 0.8 I_A \text{th} \tag{11}$$

where $I_A$th is the threshold current for the diode 10a. It has been experimentally determined that for the arrangement shown in FIG. 8 the wavelengths of the light emitted by the two diodes may be equal and mode conversion will still occur. However, if the wavelength of the light from diode 10a is less than that from diode 10b, mode conversion will not occur.

FIG. 9 shows an arrangement substantially identical to that illustrated in FIG. 1 except that the pair of laser diodes 10a and 10b are physically separated and spaced apart from each other. As in FIG. 1, a pair of currents Ia and Ib are supplied substantially concurrently to the respective diodes 10a and 10b causing them to emit their respective beams of light. If the laser diode 10a is biased so as to emit either spontaneous or laser light and this light falls upon the laser diode 10b having flowing therethrough a current less than its threshold current, the laser diode 10b will then be suitably biased and undergo a mode conversion whereupon it will emit laser light in a mode similar to the inherent laser mode of the laser diode 10a. Each beam of light serves to convert the mode of operation of the other beam. For example, one of the diodes may be converted from one mode in which light is emitted over a wide range of wavelengths to another mode in which light is emitted over a narrow range of wavelengths and vice versa, as readily understood in FIG. 10. Also, the mode of the diode may be converted so as to emit light at new wavelengths, as shown in FIG. 11.

From the foregoing, it will be appreciated that according to the teachings of the present invention, selectively applying current to a laser device can be used to selectively control the light emitted therefrom which, in turn, can be used to convert the mode of light from another laser. Moreover, the mode conversion causes either an increase or a decrease in intensity of the emitted light.

Figure 13:
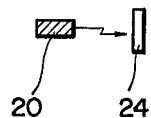
Figure 14:
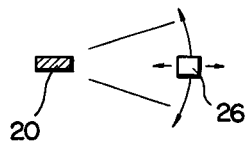

According to the principles of the invention, a beam of light can be used to convert the luminous mode of a laser device from its spontaneous emission mode to a laser emission mode different than its inherent laser emission mode. For example, as shown in FIG. 12, a beam of light emitted from a laser device 20 is directed onto another laser device (not shown) through optical slit means consisting, for example, of a pair of aligned optical slits 21 and 22 having a variable width. Either or both of the slits can vary in width to effectively convert the mode of emission of the other laser device. Alternatively, as shown in FIG. 13, a plurality of optical filters 24 may be selectively disposed in the optical path of a laser device 20 to thereby obtain a mode conversion of another laser device. Further, as shown in FIG. 14, a laser device 26 may be variably oriented with respect to a controlling laser device 20 to variably change the incident angle of light falling onto the device 26 to thereby selectively change the mode of operation of the laser device 26.

In addition, the Kerr effect exhibited by crystals of potassium dihydrogen phosphate (KDP) and ammonium dihydrogen phosphate (ADP) or the Faraday effect exhibited by tourmaline may be advantageously utilized to control the mode conversion.

It has been found that the conversion of the emission mode, as previously described, is accomplished efficiently not only with a single resonator including therein a plurality of discrete laser devices but also with a plurality of discrete resonators each including therein a single laser device and regardless of the particular material used for the laser device involved.

While the invention has been illustrated and described in conjunction with certain preferred embodiments thereof, it is to be understood that numerous changes and modifications may be resorted to without departing from the spirit and scope of the invention. For example, the invention is equally applicable to solid and gas laser devices. A beam of light from any suitable solid or gas laser device may be directed onto a laser device to convert the emission mode of the latter. Alternatively, the spontaneous light from any suitable laser device may be effectively utilized.

From the foregoing it will be appreciated that the invention has a higher efficiency of conversion as compared with the prior art techniques by which a beam of light is merely amplified and attenuated and has a wide variety of the applications aside from those specifically mentioned.

What we claim is:

1. A luminosity control device comprising:
   a. a semiconductor laser operable in one mode to emit noncoherent light when a bias current below a threshold value $I_A$th is applied thereto and in an inherent laser mode to emit coherent light having a wavelength $\lambda_A$ when a bias current greater than $I_A$th is applied thereto;
   b. means for applying a substantially constant bias current having a value equal to or greater than about eight tenths of $I_A$th to said semiconductor laser;

c. means for developing coherent light having a wavelength $\lambda_B$ where $\lambda_B$ satisfies the following relationship:

$$60A \geq \lambda_A - \lambda_B \geq 0; \text{ and}$$

d. means positioning said means for developing coherent light having a wavelength $\lambda_B$ relative to said semiconductor laser to direct the coherent light having a wavelength $\lambda_B$ to strike said semiconductor laser to bias said semiconductor laser to develop a coherent light output having a wavelength $\lambda_B$.

2. A luminosity control device according to claim 1 wherein said means for developing coherent light having a wavelength $\lambda_B$ comprises:
 a. a second semiconductor laser operable in an inherent laser mode to emit coherent light having a wavelength $\lambda_B$ when a bias current greater than a threshold value $I_B$th is applied thereto; and
 b. means for applying a bias current greater than $I_B$th to said second semiconductor laser.

3. A luminosity control device comprising:
 a. a semiconductor laser operable in one mode to emit noncoherent light when a bias current below a threshold value $I_A$th is applied thereto and in an inherent laser mode to emit coherent light having a wavelength $\lambda_A$ in a first direction when a bias current greater than $I_A$th is applied thereto;
 b. means for applying a substantially constant bias current having a value equal to or greater than about eight tenths of $I_A$th to said semiconductor laser;
 c. means for developing coherent light having a wavelength $\lambda_B$ where $\lambda_B$ satisfies the following relationship:

$$60A \geq \lambda_A - \lambda_B \geq 3A; \text{ and}$$

d. means positioning said means for developing coherent light having a wavelength $\lambda_B$ relative to said semiconductor laser to direct the coherent light having a wavelength $\lambda_B$ to strike said semiconductor laser in a second direction substantially parallel to the first direction to bias said semiconductor laser to develop a coherent light output having a wavelength $\lambda_B$.

4. A luminosity control device according to claim 3 wherein said means for developing coherent light having a wavelength $\lambda_B$ comprises:
 a. a second semiconductor laser operable in an inherent laser mode to emit coherent light having a wavelength $\lambda_B$ when a bias current greater than a threshold value $I_B$th is applied thereto; and
 b. means for applying a bias current greater than $I_B$th to said second semiconductor laser.

5. A luminosity control device according to claim 4 wherein said means for applying a bias current greater than $I_B$th to said second semiconductor laser comprises a variable regulated current source, whereby the energy of the coherent light output developed by the first-mentioned semiconductor laser may be made to vary exponentially with respect to the combined total energy of the bias currents applied to said first-mentioned and said second semiconductor lasers by varying the bias current applied to said second semiconductor laser.

6. A luminosity control device according to claim 3 wherein said means for applying a substantially constant bias current to said semiconductor laser comprises means for maintaining variations of the bias current applied to said semiconductor laser to less than about one percent of the bias current.

7. A luminosity control device comprising:
 a. a semiconductor laser operable in one mode to emit noncoherent light when a bias current below a threshold value $I_A$th is applied thereto and in an inherent laser mode to emit coherent light having a wavelength $\lambda_A$ in a first direction when a bias current greater than $I_A$th is applied thereto;
 b. means for applying a substantially constant bias current having a value equal to or greater than about eight tenths of $I_A$th to said semiconductor laser;
 c. means for developing coherent light having a wavelength $\lambda_B$ where $\lambda_B$ satisfies the following relationship:

$$60A \geq \lambda_A - \lambda_B \geq 0; \text{ and}$$

d. means positioning said means for developing coherent light having a wavelength $\lambda_B$ relative to said semiconductor laser to direct the coherent light having a wavelength $\lambda_B$ to strike said semiconductor laser in a second direction substantially orthogonal to the first direction to bias said semiconductor laser to develop a coherent light output having a wavelength $\lambda_B$.

8. A luminosity control device according to claim 7 wherein said means for developing coherent light having a wavelength $\lambda_B$ comprises:
 a. a second semiconductor laser operable in an inherent laser mode to emit coherent light having a wavelength $\lambda_B$ when a bias current greater than a threshold value $I_B$th is applied thereto; and
 b. means for applying a bias current greater than $I_B$th to said second semiconductor laser.

9. A luminosity control device according to claim 8 wherein said means for applying a bias current greater than $I_B$th to said second semiconductor laser comprises a variable regulated current source, whereby the energy of the coherent light output developed by the first-mentioned semiconductor laser may be made to vary exponentially with respect to the combined total energy of the bias currents applied to said first-mentioned and said second semiconductor lasers by varying the bias current applied to said second semiconductor laser.

10. A luminosity control device according to claim 7 wherein said means for applying a substantially constant bias current to said semiconductor laser comprises means for maintaining variations of the bias current applied to said semiconductor laser to less than about one percent of the bias current.

11. A luminosity control device comprising:
 a first semiconductor laser operable for developing light in use when biased by a bias current and operable in an inherent laser mode when the bias current exceeds a certain threshold value;
 first biasing means for biasing said first semiconductor laser with a current equal to at least 80% of the threshold value required to operate said first semiconductor laser in its inherent laser mode;
 a second semiconductor laser operable in an inherent laser mode when biased by a bias current which exceeds a certain threshold value;
 second biasing means for biasing said second semiconductor laser with a current at least equal to the threshold value required to operate said second semiconductor laser in its inherent laser mode; and means relatively positioning said first and second semiconductor lasers so that light emitted from said second semiconductor laser is incident on said first semiconductor laser, whereby said first semiconductor laser emits light in the laser mode of said second semiconductor laser when it is simultaneously biased with a current equal to at least 80% of the threshold current and receiving the light emitted from said second semiconductor laser operating in its laser mode, and wherein the intensity of the light emitted by said first semiconductor laser while operating in the inherent laser mode of said second semiconductor laser is dependent on the intensity of the light emitted by said second semiconductor laser while it is operating in its inherent laser mode, and is independent of a length of said second semiconductor laser.

12. A method of controlling luminosity of a semiconductor laser, comprising:

biasing a first semiconductor laser, which exhibits a bias threshold value above which it emits light in an inherent laser mode, with a substantially constant bias current equal to or greater than 80% of the threshold value;

illuminating the first semiconductor laser with light emitted from a second semiconductor laser biased to operate in an inherent laser mode, whereby the first semiconductor laser operates in the inherent laser mode of the second semiconductor laser to emit light and wherein the intensity of the light emitted by the first semiconductor laser while operating in the inherent laser mode of the second semiconductor laser is exponentially related to the total bias currents supplied to the first and second semiconductor lasers; and varying a bias current supplied to the second semiconductor laser, while maintaining the bias current supplied to the first semiconductor constant, to vary the intensity of the light emitted by the first semiconductor laser while it is operating in the inherent laser mode of the second semiconductor laser.

* * * * *